United States Patent [19]
Holly et al.

[11] Patent Number: 4,953,221
[45] Date of Patent: Aug. 28, 1990

[54] CONSTANT POWER RATIO AUTOMATIC GAIN CONTROL

[75] Inventors: Arthur C. Holly; Charles R. Culbertson, both of Austin; David L. Ham, San Antonio, all of Tex.

[73] Assignee: Walkaway Technologies, Inc., San Antonio, Tex.

[21] Appl. No.: 367,301

[22] Filed: Jun. 15, 1989

[51] Int. Cl.$^5$ .............................................. H03G 3/00
[52] U.S. Cl. ...................................... 381/108; 381/96
[58] Field of Search .................... 381/107, 108, 96, 59

[56] References Cited

U.S. PATENT DOCUMENTS 4,306,115 12/1981 Humphrey ........................ 381/108
4,628,526 12/1986 Germer ............................. 381/108

*Primary Examiner*—Forester W. Isen
*Attorney, Agent, or Firm*—Matthews & Branscomb

[57] ABSTRACT

A novel and improved automatic gain control (AGC) circuit which is ideally suited for use with sound systems which are operated in a very large environment, such as a supermarket or auditorium. The preferred embodiment of the circuit comprises first and second input channels and a single output channel. The first input channel is a feedback signal provided by a microphone which is placed near one of the speakers of the sound system. The second input channel receives a music signal which is being played by the sound system. The output of the circuit is a music signal which has a constant ratio relative to the noise detected in the environment. Constant power ratio operation of the system is achieved through the use of logarithmic processing of the signals in each of the respective input channels. Control circuitry is provided to maintain the gain level of the system at a constant level during periods of time when no music is present on the second input channel.

8 Claims, 2 Drawing Sheets

CONSTANT POWER RATIO AUTOMATIC GAIN CONTROL

FIELD OF THE INVENTION

The present invention relates generally to automatic gain control circuits. More specifically, the present invention provides an improved automatic gain control system which is capable of maintaining a constant power ratio of signal to noise.

BACKGROUND

In situations where sound systems are being used in noisy environments, the audibility of the sound system often suffers from ambient noise level fluctuations due to change in the activity level with the room environment. One common solution to this problem is for an individual to adjust the volume of the sound system according to a subjective evaluation of the level of ambient noise in the environment. This approach works well when the information content of the broadcast is low, as is often the case in background music systems. However, in foreground systems where announcements or commercials are being broadcast, the information content is higher and it is of paramount importance for individuals to hear the program material regardless of background noise level. Human control of the volume of the sound system is generally inadequate to insure proper control of a sound system for use in such a foregoing information system. Furthermore, human control is generally inadequate in environments where the ambient noise may change by a significant amount during the period of a day.

One solution to the above described problems is the use of an "automatic gain control" (AGC) device to maintain the volume of the sound system at the desired level. In theory, AGCs maintain constant audibility by automatically adjusting the sound level to compensate for the daily fluctuations of ambient noise in the environment. One of the common problems in prior art AGCs, however, is a phenomenon termed "runaway," a condition where the sound volume increases to a level that is high enough to become intolerable. The most significant contributing factor to runaway is the dependence of prior art AGCs on signal level and bandwidth.

Many prior art techniques have been proposed for automatically adjusting the volume of a sound system according to the level of ambient noise in the environment. In U.S. Pat. No. 3,290,442, a technique is described whereby a portion of the signal input to the loudspeaker is used in conjunction with a signal derived from a microphone channel to maintain a sound level that is a constant ratio to the noise volume. Mathematical analysis of this particular technique, however, indicates that the gain adjusting effect of the circuit is dependent upon the signal itself, thus indicating the creating of a runaway condition under certain circumstances of signal and noise. In another approach, U.S. Pat. Nos. 3,934,084 and 3,934,085 describe a technique whereby the absence of an input signal is detected and, during the interval of silence, the ambient noise is sampled by a microphone channel. The gain of the input signal channel is increased or decreased according to the resulting noise measurement in preparation for the next input signal.

Other techniques for automatic gain control, such as those disclosed in U.S. Pat. Nos. 4,247,955; 4,476,571; 4,553,257; and 4,641,344 provide various means for overcoming shortfalls associated with car radio and stereo systems with regard to varying ambient noise conditions. In most of these techniques, it is assumed that the noise is sampled in a frequency band that is separated from the information band either naturally or with the help or filtering, so that the operation of the circuit is not affected by the signal characteristics.

Another patent, U.S. Pat. No. 4,479,237 provides a means for a variable slope control, whereby the sound level is increased as a function of ambient noise, depending upon the magnitude of the means noise level. Finally, another technique is described in U.S. Pat. No. 4,628,526 in which noise and signal are both detected in a microphone channel and then compared to the signal channel. The degree of similarity is then derived by forming comparisons of the slopes of the envelopes of the two channels. The degree of similarity is used to determine the amount of ambient noise present, which leads to an automatic adjustment of the signal volume.

To operate properly, an AGC should be designed to maintain a constant power ratio of signal to noise. The AGC provided by the present invention, as described in greater detail below, advances the state of the art by providing an automatic gain control system which is capable of maintaining a constant power ratio of signal to noise, thus maintaining audible levels of program material without being susceptible to runaway.

SUMMARY OF THE INVENTION

The present invention provides a novel and improved automatic gain control (AGC) circuit which is capable of maintaining a constant power ratio between signal and noise. The AGC of the present invention is ideally suited for used with sound systems which are operated in a very large environment, such as a supermarket or auditorium.

The AGC circuit of the preferred embodiment comprises first and second input channel and a single output channel. The first input channel is a feedback signal provided by a microphone which is placed near one of the speakers of the sound system. The second input channel is music which is being played by the sound system. The output of the circuit is a music signal which has a constant ratio relative to the noise detected in the environment. Constant power ratio operation of the system is achieved through the use of logarithmic processing of the signals in each of the respective input channels. Control circuitry is also provided to maintain the gain level of the system at a constant level during periods of time when no music is present on the second input channel.

DETAILED DESCRIPTION OF THE PREFERRED EMBODIMENT

Figure 1:
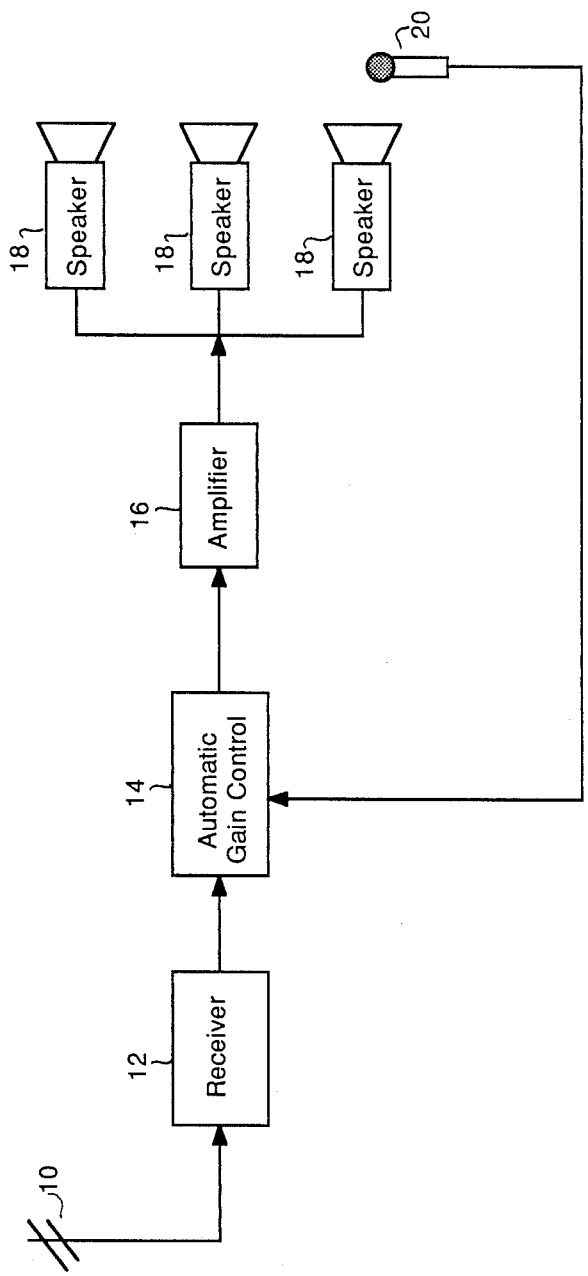
FIG. 1 is a schematic illustration of a sound system employing the automatic gain control circuit of the present invention.

FIG. 1 is a schematic illustration of a sound system using the automatic gain control circuit of the present invention. A radio signal from the antenna 10 is detected by a receiver 12 which provides a music input signal to the automatic gain control circuit 14. The output of the automatic gain control circuit 14 is used to control the volume level of an amplifier 16 which provides a audio signal to a plurality of speakers 18. A microphone 20 is placed near the output of one of the speakers 18. The output of the microphone 20 provides a feedback signal which is used as one of the inputs to the automatic gain control 14, as described in greater detail below.

Figure 2:
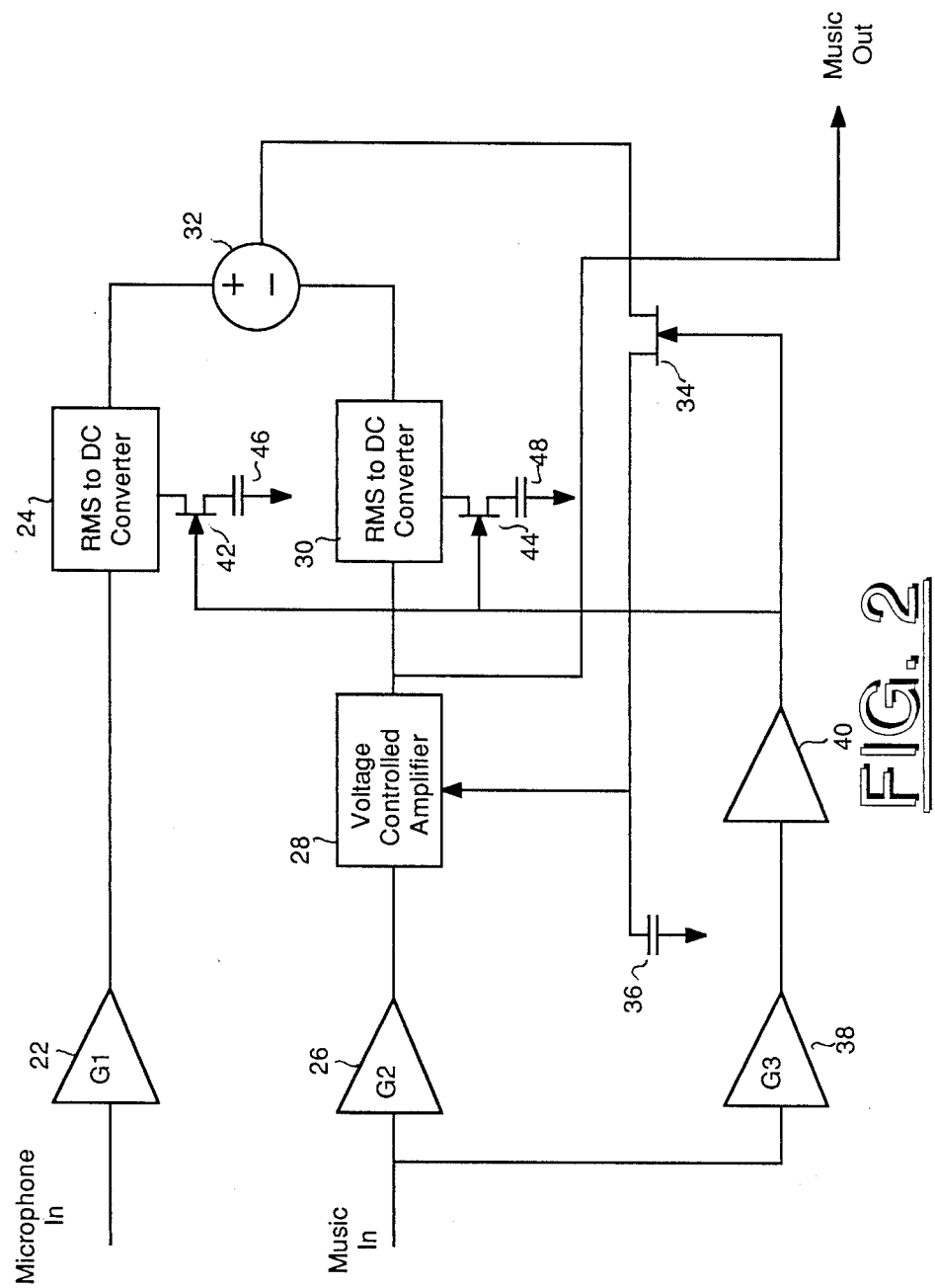
FIG. 2 is a schematic illustration of the automatic gain control circuit of the present invention.

Details relating to the automatic gain control circuit 14 can be seen by referring to FIG. 2. The circuit comprises first and second input channels and a single output channel. The inputs are in the form of a music signal and a microphone signal. The music input is the source material to be played through the sound system and serves as a reference signal for the operation of the AGC. The microphone input is derived from the microphone 20, discussed above, that is placed within the environment of the sound system. The microphone senses the music being played, as well as the existing ambient noise. In the preferred embodiment of the invention, the microphone is placed very close to one of the speakers 18, e.g., within one to three feet of the speaker.

The microphone channel ammplifies the microphone input signal with an amplifier 22 having a gain G1, and then detects the signal with a RMS to DC converer 24. The RMS to DC converter used in the preferred embodiment of the invention is an Analog Devices model no. AD536. In addition to the detection function, the RMS to DC converter 24 provides averaging of the signal so that impulsive noise and signal bandwidth effects can be minimized. The output of the RMS to DC converter is a logarithmic verison of the detected signal. This logarithmic relationship is an important feature in the operation of the AGC, as will be discussed in more detail below.

The music channel amplifiers the music signal from the receiver 12 using an amplifier 26 having a gain, G2. The amplified music signal is passed through a voltage controlled amplifier 28, which in the preferred embodiment is a Motorola model TDA1524. The gain of the voltage controlled amplifier is controlled by another portion of the AGC circuit, discussed below. The output of the voltage controlled amplifier is passed through an RMS to DC converter 30, which is identical to the RMS to DC converter 24 used in the microphone channel.

The outputs of the respective RMS to DC converters are provided to a differencer 32, which is in the form of an op-amp operating in a differential configuration. The op-amp used in the preferred embodiment of the invention is a Harris 4741 op-amp. Ideally, the output of the differencer 32 will be a control voltage that represents the difference between the levels of the music channel and the microphone channel, respectively. The microphone channel contains a sample of the music that is being played through the speaker 18 of the sound system and the ambient noise of the room. The difference signal produced by the differencer 32 is actually a residual signal which represents the noise level of the room. Thus, if the level of noise increases, the control voltage will likewise increase, thereby causing the voltage controlled amplifier to increase the gain of the music channel which results in an increased output level for the circuit.

Because the RMS to DC converters 24 and 30 provide logarithmic output signals, the resulting control voltage (which represents the ambient noise of the room) causes the system to maintain a constant ratio between the signal and noise. That is, regardless of the signal level, the music contained in the music and mircrophone channels will always be in constant proportion to one another. Taking a log difference between the two channel is tantamount to performing a ratio of the two channels, such that changing levels of music will not cause the control voltage to exhibit large and unwanted changes.

The above relationship can be better understood from a mathematical description of the signals produced by each of the channels of the automatic gain control circuit. As discussed above, the microphone channel of the circuit contains a sample of the music played by the speakers and the ambient noise in the room. Thus the output, $S_{mic}$, of the RMS to DC converter 24 can be represented as:

$$S_{mic} = \text{Log}(\alpha G_1 S + N) \quad (1)$$

where
 $G_1$ = The gain of the amplifier 22 in channel 1;
 $S$ = the music signal produced by the speaker;
 $N$ = the noise contribution to the signal; and
 $\alpha$ = the gain due to spreading, absorption, transfer characteristics of the speaker and microphone, and amplifier setting.

The output signal, $S_{music}$, produced by the RMS to DC converter 30 can be represented as:

$$S_{music} = \text{Log}(S_{diff} G_2 S)$$

where
 $G_2$ = The gain of amplified 26 in channel 2;
 $S_{diff}$ = the output of the differencer.

The output $S_{diff}$ of the differencer 32 will be the difference between equations (1) and (2):

$$\begin{aligned}
S_{diff} &= \text{Log}(\alpha G_1 S + N) - \text{Log}(S_{diff} G_2 S) & (3) \\
&= \text{Log}[(\alpha G_1 S + N)/(S_{diff} G_2 S)] & (4) \\
&= \text{Log}[(1/S_{diff} G_2)(\alpha G_1 + N/S)] & (5)
\end{aligned}$$

From equation (5), it can be seen that the output of the differencer circuit is in the form of a signal to noise dependent voltage.

The advantages of the invention circuit can be seen by comparing the characteristic of the $S_{diff}$ signal shown in equation (5) with the $S_{diff}$ which would be produced by a conventional difference of linear signals:

$$\begin{aligned}
S_{diff} &= (\alpha G_1 S + N) - S_{diff} G_2 S & (6) \\
&= S(\alpha G_1 - S_{diff} G_2) + N & (7) \\
&= S[(\alpha G_1 - S_{diff} G_2) + (N/S)] & (8)
\end{aligned}$$

As can be seen from equation (8), the difference signal resulting from conventional RMS to DC converters contains a signal multiplier.

Referring again to FIG. 2, it can be seen that the output signal of the differencer 32 is passed through a switch 34 prior to being used as an input signal for the voltage controlled amplifier 28. the function of the switch in the control voltage signal path is to freeze the action of the AGC when music is not being played. This ensures that if long periods of silence occur in the source signal, the gain of the system will remain constant until music begins playing again. The switch 34 is controlled by a music detector comprising an amplifier 38, having a gain G3, a detector and compartor 40 that determines whether the detected signal exceeds a predetermined and preset threshold. If the detected signal exceeds the threshold, it is presumed that music is being played and the detector/comparator 40 produces an output signal voltage to cause the switch 34 to remain closed, thus allowing normal operation of the feed back path. If the detected signal level falls below the predetermined threshold, then the switch 34 is opened to maintain the voltage controlled amplifier at its previous level. The output of the comparator 40 is also provided to switches 42 and 44 which control capacitors 46 and 48. Thus the charges on capacitor 46 and 48 are maintained during the time interval that music is not being played.

One of the novel features so the automatic gain control circuit of present invention is the placement of the microphone close to one of the speakers being controlled by the system. Prior art automatic gain control circuits typically place a microphone at a remote location in the room to prevent feedback. Such prior art systems typically operate by simply measuring changes in the ambient noise and using the change in the ambient noise level to generate a control signal to increase or decrease the gain of the amplifier circuit. Such systems lack the necessary accuracy for use in a foreground system. Furthermore, such systems are inherently susceptible to runaway.

Although the automatic gain control circuit of the present invention has been described in connection with the preferred embodiment, it is not intended to be limited to the specified form set forth herein, but on the contrary, it is intended to cover such modifications, alternatives, and equivalents as can be included within the scope and spirit of the invention as defined by the appended claims.

What is claimed is:

1. An automatic gain control system for controlling an audio system comprising:
    first and second input channels for receiving first and second input signals, respectively, said first input signal being an audio signal, said second input signal being a feedback signal, said first and second intput channels comprising first and second RMS to DC converters, respectively, for detecting said first and second input signals;
    an output channel carrying a control signal for controlling a sound producing device:
    means for detecting ambient noise and sound produced by said sound producing device and for generating said feedback signal thereform; and
    control means responsive to said first and second input signals, said control means generating said control signal, said control signal causing said sound producing device to produce sound at a constant ratio relative to said detected ambient noise, said control means for producing said control signal comprising a voltage controlled amplifier.

2. The method according to claim 1, said feedback signal being produced by a microphone located at a predetermined distance from said sound producing device.

3. The method according to claim 2, said predetermined distance being between one and three feet from said sound producing device.

4. The automatic gain control system according to claim 1, said first and second RMS to DC converters producing first and second logarithmic output signals, said control signal representing the difference between said first and second logarithmic output signals.

5. The automatic gain control system according to claim 4, said means for detecting said ambient noise and said sound produced by said sound producing device comprising a microphone placed at a predetermined location from said sound producing device.

6. The automatic gain control system according to claim 5, said predetermined distance being between one and three feet from said sound producing device.

7. The automatic gain control system according to claim 6, further comprising means for detecting the absence of sid first input signal and for maintaining the gain of said system at a constant level during time intervals wherein said first input signal is absent from said first input channel.

8. A method for providing automatic gain control for controlling an audio system, comprising the steps of:
    detecting a first input signal comprising an audio signal:
    amplifying said audio sign and using said audio signal to control a sound producing device:
    detecting a second input signal comprising a feedback signal, said feedback signal being a combination of ambient noise and sound produced by said sound producing device:
    processing said first and second input signals in first and secod RMS to DC converters, said first and second RMS to DC converts producind first and second logarithmic output signals, respectively;
    combining said first and second logarithmic output signals to obtain a difference signal corresponding to the difference between the levels of said first and second input channels: and
    using said difference signal to generate a control signal to cause said sound producing device to produce a sound signal having a constant ratio relative to said ambient noise said control signal representing the difference between said first and second logarithmic output signals.

* * * * *